US006700183B2

(12) United States Patent
Jiang

(10) Patent No.: US 6,700,183 B2
(45) Date of Patent: Mar. 2, 2004

(54) LOW TEMPERATURE DIE ATTACHING MATERIAL FOR BOC PACKAGES AND PRODUCTS COMPRISING SUCH MATERIAL

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/003,260

(22) Filed: Dec. 6, 2001

(65) Prior Publication Data

US 2002/0119601 A1 Aug. 29, 2002

Related U.S. Application Data

(62) Division of application No. 09/790,527, filed on Feb. 23, 2001, now Pat. No. 6,531,340.

(51) Int. Cl.[7] .............................................. H01L 23/495
(52) U.S. Cl. ........................ 257/666; 428/221; 257/734
(58) Field of Search ................................. 257/666, 783, 257/782, 778, 737, 738, 734; 428/221, 312.6, 312.8, 317.7

(56) References Cited

U.S. PATENT DOCUMENTS

| | | |
|---|---|---|
| 4,808,639 A | 2/1989 | Chernack |
| 4,940,852 A | 7/1990 | Chernack |
| 5,532,293 A | 7/1996 | Landis |
| 5,821,293 A | 10/1998 | Roesch et al. |
| 5,843,251 A * | 12/1998 | Tsukagoshi et al. ........... 156/64 |
| 5,919,407 A | 7/1999 | Chao |
| 6,004,417 A | 12/1999 | Roesch et al. |
| 6,071,371 A | 6/2000 | Leonard et al. |
| 6,113,728 A | 9/2000 | Tsukagoshi et al. |
| 6,277,481 B1 * | 8/2001 | Sugino et al. ........... 428/317.1 |

FOREIGN PATENT DOCUMENTS

EP    0 512 546 A1    11/1992

OTHER PUBLICATIONS

Ronald J. Versic, "Flavor Encapsulation, An Overview," American Chemical Society Symposium Series No. 370, 1988.*.

* cited by examiner

Primary Examiner—Roy Potter
(74) Attorney, Agent, or Firm—Dickstein Shapiro Morin & Oshinsky LLP

(57) ABSTRACT

An apparatus and method is provided for forming a board-on-chip (BOC) package. An adhesive material including a carrier and microcapsules distributed in the carrier is used to bond a semiconductor component to a mounting surface in a BOC package. The microcapsules contain a hardener and/or a catalyst that, when combined with the carrier, initiate a bonding reaction. The contents of the microcapsules are released via application of an external influence, such as pressure or heat, when the bonding reaction is desired to begin. The use of microcapsules permits the formulation of adhesive blends with a substantially increased pot life, increased stability and reliability at high temperatures, and favorable low temperature reaction and bonding characteristics.

40 Claims, 6 Drawing Sheets

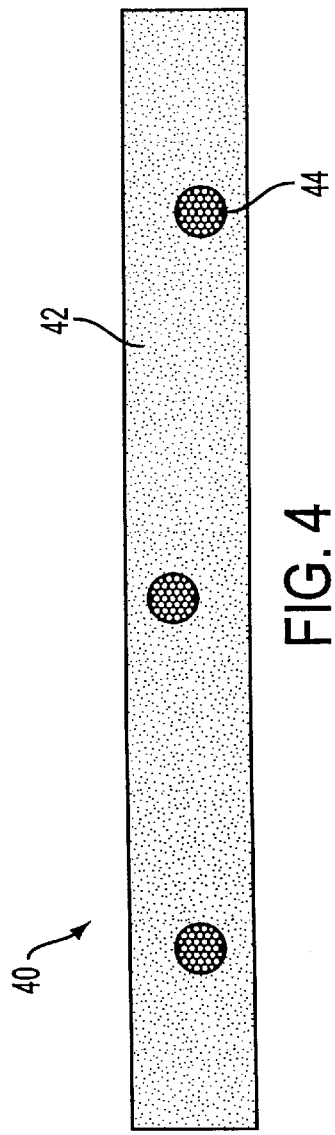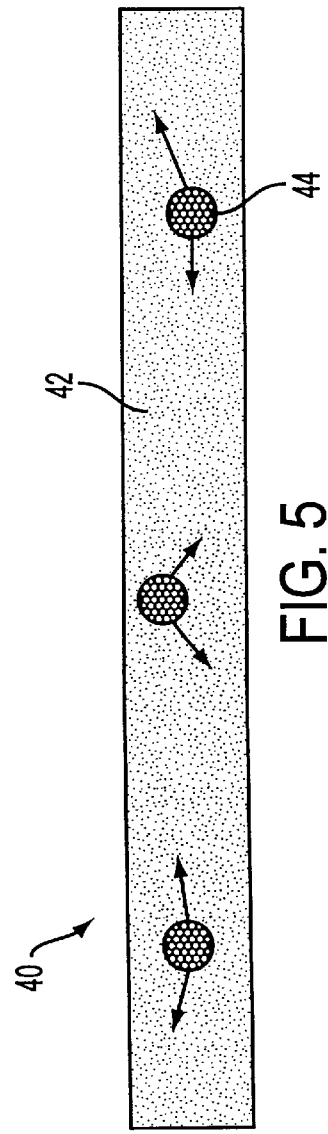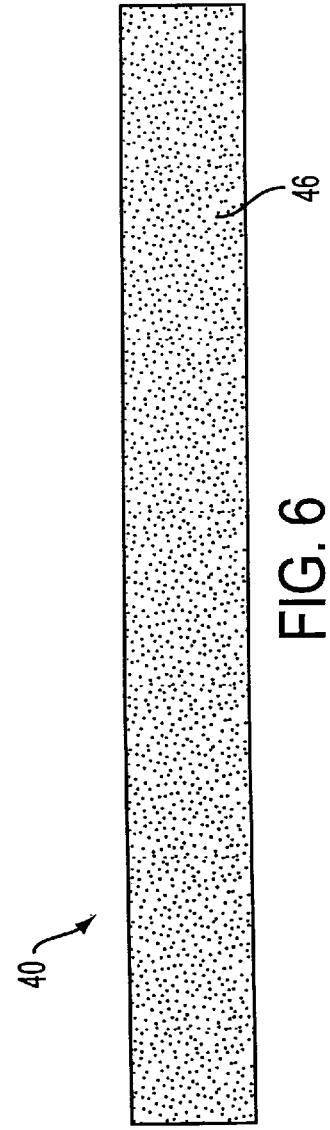

LOW TEMPERATURE DIE ATTACHING MATERIAL FOR BOC PACKAGES AND PRODUCTS COMPRISING SUCH MATERIAL

This is a divisional of U.S. patent application Ser. No. 09/790,527, filed Feb. 23, 2001, now U.S. Pat. No. 6,531,340, the entire disclosure of which is incorporated herein by reference.

FIELD OF THE INVENTION

The present invention relates to packages for semiconductor devices, and in particular to using an adhesive material containing microcapsules to attach semiconductor components in a board-on-chip (BOC) package.

BACKGROUND OF THE INVENTION

Semiconductor devices, for example dynamic random access memory (DRAM) devices, are shrinking in the sense that smaller devices are being manufactured that are able to handle larger volumes of data at faster data transfer rates. As a result, semiconductor manufacturers are moving toward chip-scale packages (CSP) for semiconductor components which have a small size and fine pitch wiring.

One exemplary CSP is shown in FIG. 1. The package 20 has a board-on-chip (BOC) construction whereby a semiconductor component, such as an integrated circuit (IC) chip 202, is attached to a base material, such as a substrate 206, with an adhesive material 204. The adhesive material 204 is interposed between and bonds the IC chip 202 and the substrate 206. The package 20 also includes electrical connectors, e.g. solder balls 208 and metal wires 210, for connection of the IC chip 202 to external components.

Conventional adhesives used in BOC packages are designed to exhibit certain reliability characteristics due to the adverse environments encountered during subsequent manufacturing and assembly processes. For example, adhesives used in BOC packages must be stable at high temperatures (e.g., greater than about 150 degrees Celsius) in order to ensure reliability of the package during subsequent processing such as exposure to a high-temperature solder bath.

In addition, health-related issues present other design factors for conventional adhesives used in BOC packaging. For example, to avoid excessive PCB outgassing, adhesives used in BOC packages must permit attachment at low temperatures (e.g., lower than about 150 degrees Celsius).

A problem exists with conventional adhesives used in BOC packaging in that these materials often represent a compromise between the low temperature attachment and high temperature stability requirements. These adhesives usually comprise a hybrid material or mixture composed of two materials that differ in glass transition temperature (Tg), often combined in an epoxy blend. The glass transition temperature, Tg, is the temperature at which a rigid glass becomes rubbery. A conventional hybrid adhesive may combine a low Tg material, which exhibits the desired low temperature attachment characteristic, with a high Tg material, which exhibits the desired high temperature stability characteristic. The resulting blend usually exhibits attachment and stability characteristics that fall between the two materials, but possess the desired attachment and/or stability qualities of neither material.

Therefore, there is a strong need and desire for an adhesive material for use in semiconductor packages that exhibits the desired attachment characteristics of available low Tg materials and the stability qualities of available high Tg materials.

SUMMARY OF THE INVENTION

An apparatus and method for forming a board-on-chip (BOC) package is provided. An adhesive material including a carrier and microcapsules distributed in the carrier is provided which may be used to bond a semiconductor component to a mounting surface in a BOC package. The microcapsules contain a hardener and/or a catalyst that, when combined with the carrier, initiate a bonding reaction. The contents of the microcapsules are released via application of an external influence, such as pressure or heat, when the bonding reaction is desired to begin. The use of microcapsules permits the use of adhesive blends with increased stability and reliability at high temperatures, as well as favorable low temperature reaction and bonding characteristics. In addition, the microencapsulated adhesive blend exhibits substantially increased pot life.

In another aspect of the invention, the use of microcapsules permits formulation of adhesive materials suitable for use in semiconductor packages allowing room-temperature attachment.

The adhesive material may also be formulated in an adhesive tape for ease of use in BOC packaging applications.

BRIEF DESCRIPTION OF THE DRAWINGS

The above and other advantages and features of the invention will be more clearly understood from the following detailed description of the invention which is provided in connection with the accompanying drawings in which:

FIG. 4 illustrates a portion of an adhesive tape constructed in accordance with an exemplary embodiment of the invention;

FIG. 5 illustrates the adhesive tape portion of FIG. 2 under pressure;

FIG. 6 illustrates the adhesive tape portion of FIG. 3 after cross-linking;

DETAILED DESCRIPTION OF THE PREFERRED EMBODIMENTS

Figure 1:
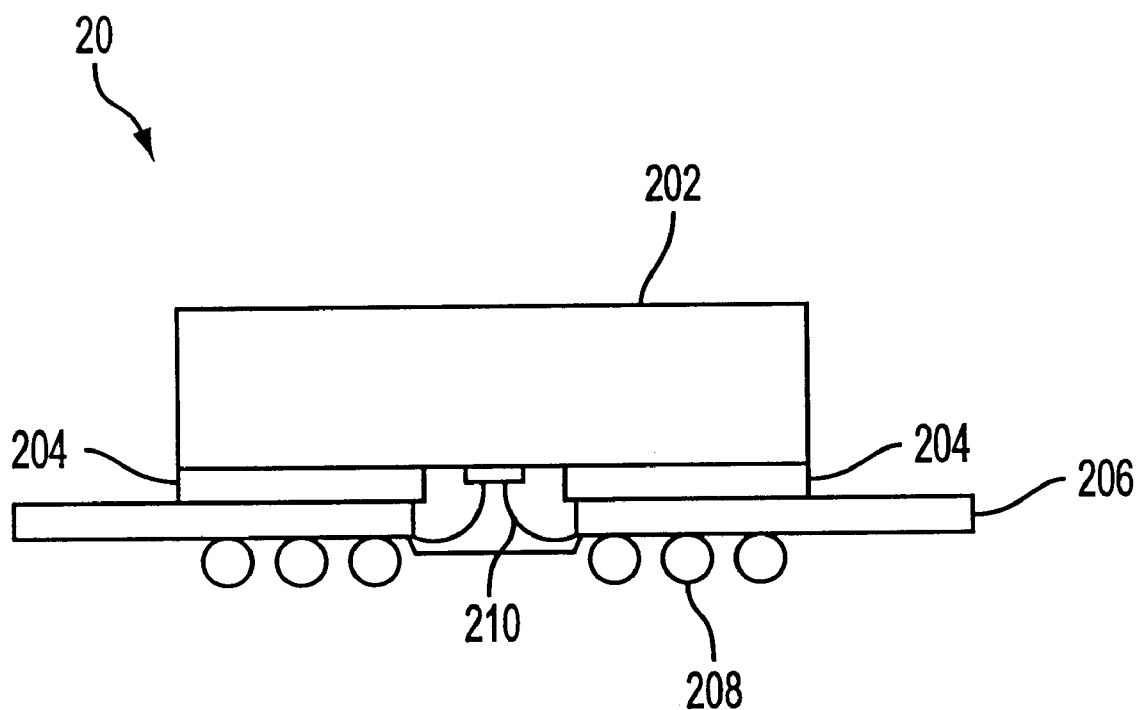
FIG. 1 illustrates a cross-sectional view of a conventional board-on-chip (BOC) semiconductor package.
Figure 2:
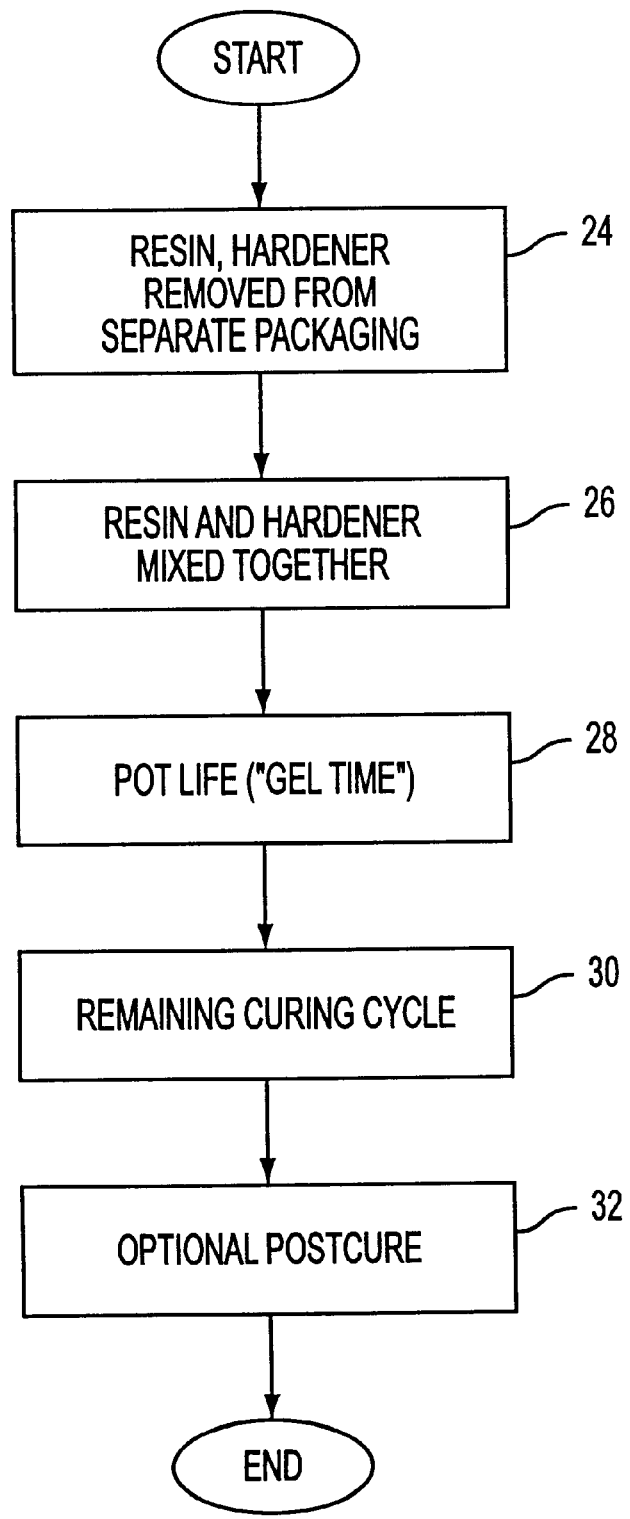
FIG. 2 illustrates a simplified block diagram of a conventional method of using an adhesive blend.

Because the conventional method of using an adhesive material in the formation of a semiconductor package is instructive to an understanding of the methodologies of the present invention, a typical adhesive formulation process will be described with reference to FIG. 2. FIG. 2 shows a simplified block diagram of a method conventionally used in constructing a board-on-chip (BOC) package. The method of FIG. 2 includes blending an epoxy resin and hardener to form an epoxy compound. Such an epoxy compound is often used as the adhesive 204 (FIG. 1) for BOC packages. The resin and hardener are removed from their separate packaging in method segment 24, and mixed in method segment 26. The resin and hardener usually must be mixed in specific proportions so that an appropriate amount of resin is activated by an appropriately proportional amount of hardener. In addition, thorough mixing is typically required to ensure that the hardener is distributed evenly throughout the resin.

As the resin and hardener are mixed, a chemical reaction begins that can last for a variable time period (e.g., ranging from minutes to days), depending on several factors including the particular resin or hardener used, temperature, and mass of the reactants. The resin-hardener mixture hardens during this chemical reaction (method segment 28), and the hardening time is called the "pot life," also known as the "working life" or "gel time." During the pot life, the adhesive material may be applied to or positioned on the surfaces to be bonded (e.g., between the IC chip and substrate of the BOC package). The chemical reaction between the resin and hardener is usually exothermic (heat generating), and thus to avoid excessive instantaneous generation of heat, a longer pot life is often desired.

The pot life is only the first phase of the curing cycle. During the remainder of the curing cycle (method segment 30), the molecules of the mixture continue to crosslink, and the chemical, thermal, and structural properties of the mixture continue to develop until they reach the levels of the final epoxy compound at the end of the curing cycle. In addition, an optional "post-cure" process may be used to enhance the chemical, thermal, and/or structural properties of the epoxy compound (method segment 32). A typical postcure process includes heating the epoxy compound to an elevated temperature (i.e., above room temperature) for a specified period.

Figure 3:
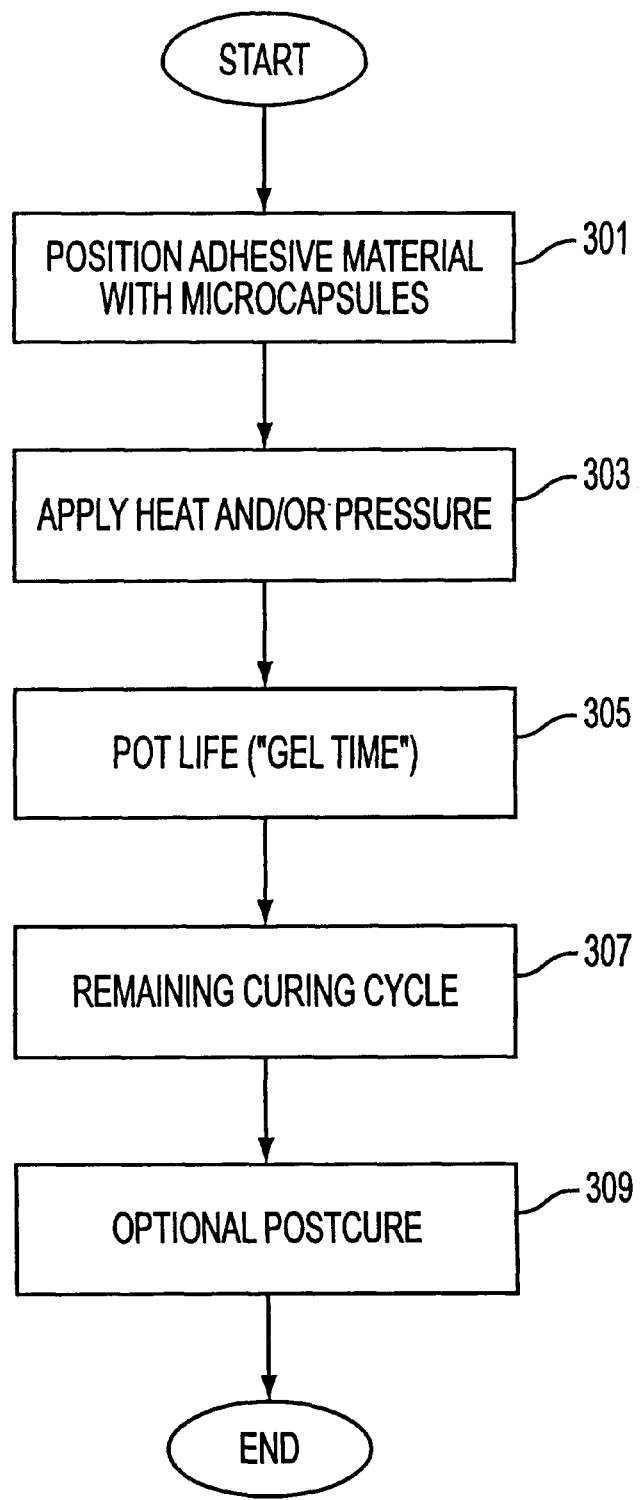
FIG. 3 illustrates a simplified block diagram of an exemplary embodiment of the method of the invention.

In contrast to the conventional process illustrated in FIG. 2, FIG. 3 shows a simplified block diagram of a method of applying an adhesive material in accordance with an exemplary embodiment of the invention. This method may be used in constructing a board-on-chip (BOC) package. In accordance with the invention, one or both of the resin and hardener is provided in microcapsules suspended in a carrier, in a single package.

The microcapsules include a permeable exterior that, when triggered (e.g., by heat and/or pressure), releases the contents of microcapsule into the carrier. The carrier and microcapsules are packaged for use as an adhesive, e.g. adhesive material 204 (FIG. 1) for BOC packages. Referring to FIG. 3, one exemplary embodiment of the adhesive material includes the carrier and microcapsules together in a single package that may be positioned as desired (method segment 301). When the adhesive material is appropriately positioned at a location where bonding is desired, an external influence such as heat and/or pressure may be applied to activate the adhesive material, i.e., release the contents of the microcapsules into the carrier (method segment 303). The microcapsules are distributed throughout the carrier, and thus the contents of the microcapsules when released mix with the carrier material. The chemical reaction of the epoxy compound begins, and during the pot life (method segment 305), the adhesive material hardens. The curing cycle of epoxy compound continues as noted through crosslinking during the remaining curing cycle (method segment 307) and optional postcure (method segment 309).

An exemplary embodiment of an adhesive material 40 in accordance with the invention is illustrated undergoing activation and crosslinking in FIGS. 4–6. Referring to FIG. 4, an adhesive material 40 is shown including a carrier 42 and microcapsules 44 distributed throughout the carrier 42. The adhesive material 40 includes both a resin and a hardener of an epoxy, although at least one of these two components is encapsulated in the microcapsules 44. For example, the carrier 42 may comprise a resin, and the contents of the microcapsules 44 may comprise a hardener. Alternatively, the carrier 42 may comprise a hardener, and the contents of the microcapsules 44 may comprise a resin. Also, the carrier 42 may comprise neither a resin nor a hardener, and two types of microcapsules 44 may be present in the carrier 42; the contents of a first type including a resin and the contents of a second type including a hardener.

Exemplary resin materials that may be used in accordance with the invention include epoxides containing polyimide, silicone epoxy, or another polymeric resin containing epoxied functional groups. Exemplary hardener materials that may be used in accordance with the invention include anhydride, phenolic, imine and amide.

In addition, the adhesive material 40 may include a catalyst material. A catalyst material may be included in an epoxy to stimulate or expedite the chemical reaction of the epoxy components (the resin and hardener). For example, a reactive catalyst may be included in order to stimulate the chemical reaction of the epoxy resin and hardener at a low temperature, such as room temperature. The catalyst material may be included in the carrier 42 and/or the microcapsules 44. For example, the carrier 42 may comprise a resin, and the contents of the microcapsules 44 may include both a hardener and a catalyst. Thus, when the contents of the microcapsules 44 are released, both the hardener and the catalyst are released and mixed into the carrier 42, commencing the epoxy chemical reaction. Exemplary catalyst materials that may be used in accordance with the invention include Lewis acid and imidazole.

When both a hardener and catalyst are used, separate microcapsules may be used for each of the hardener and catalyst. Because hardeners are generally relatively heavier (about 10–30% of the weight of the adhesive) than catalysts (about 0.01–5% of the weight of the adhesive), it may be desirable to use an encapsulated catalyst for typical applications.

Referring to FIG. 5, the microcapsules 44 are activated via the application of an external influence such as heat and/or pressure. Several types of microcapsules 44 may be used in accordance with the invention, and the different types of microcapsules 44 may have a variety of different release mechanisms. For example, the contents of one type of microcapsule may be released upon application of a compressive force that breaks open the microcapsules 44. The compressive force may be generated by specialized machinery used in the BOC packaging process such the ESC 9200 manufactured by ESC Manufacturing, Inc. For another example, another type of microcapsule may be broken open in a shear mode by a mechanical blender or mixer. For a further example, the permeable exterior of another type of microcapsule may be dissolved, releasing the contents, when exposed to an elevated temperature.

Exemplary microcapsule shell materials that may be used in accordance with the invention include those that are pressure sensitive and/or thermal sensitive such as polymethyl methacrylate (PMMA).

Referring to FIG. 6, after the adhesive material 40 is activated and the contents of the microcapsules 44 released, a chemical reaction between the resin and hardener (and optionally a catalyst) occurs, eventually resulting in a crosslinked epoxy compound 46.

The carrier 42 may include a polymeric resin formulation with a low glass transition temperature (Tg) (e.g., less than 150 degrees Celsius), and the microcapsules 44 may include hardener and/or catalyst materials which react with the carrier 42 to form a high Tg material (e.g., greater than 150 degrees Celsius). Prior to release of the microcapsules 44, the adhesive material 40 may exhibit the low-temperature attachment characteristics of the low-Tg resin in the carrier 42. This quality may permit desirable room-temperature attachment of the semiconductor components of a BOC package. After the contents of the microcapsules 44 are released, the hardener and/or catalyst may cause the resulting epoxy compound to exhibit the increased stability and reliability characteristics of a high-Tg polymeric resin. Also, postcure heat treatment may be performed to further develop the stability and reliability characteristics of the epoxy compound.

The microcapsules 44 permit use of adhesive materials considered unusable in conventional semiconductor packaging applications. Combinations of resins, catalysts and hardeners that exhibited a short pot life and/or fast cure time may have been unusable for semiconductor packaging due to the time expended in mixing and applying a conventional adhesive. In accordance with the invention, the adhesive material 40 may be applied and positioned as desired prior to activation of the epoxy chemical reaction. Thus the need is eliminated for a minimum pot life during which the adhesive is applied to semiconductor components.

Figure 7:
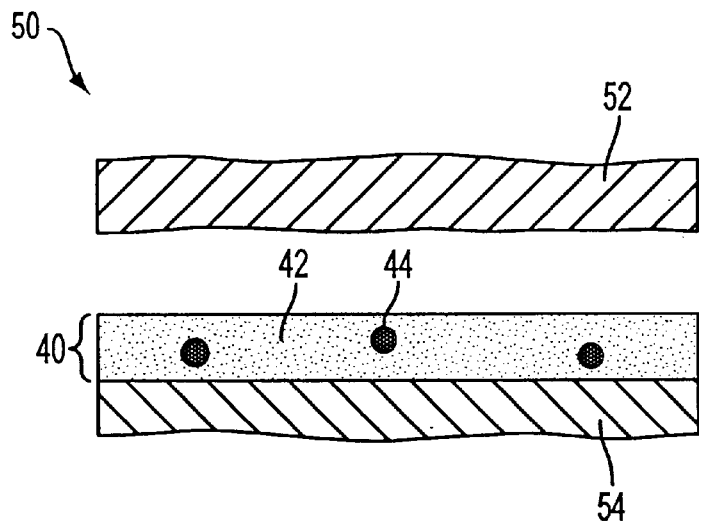
FIG. 7 illustrates a portion of a board-on-chip (BOC) package undergoing construction in accordance with an exemplary embodiment of the invention.
Figure 8:
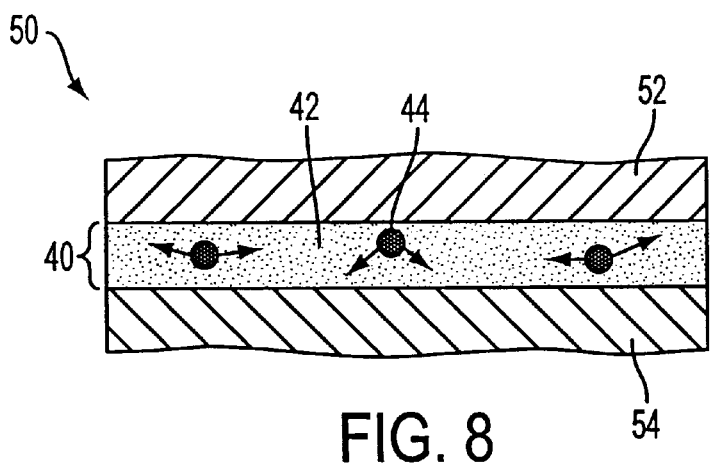
FIG. 8 illustrates the BOC package portion of FIG. 5 at a later stage of construction.
Figure 9:
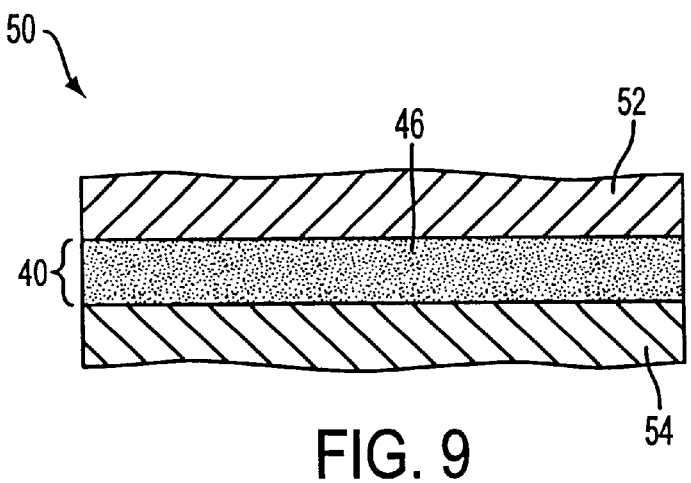
FIG. 9 illustrates the BOC package portion of FIG. 6 at a later stage of construction.

FIGS. 7–9 illustrate the use of an adhesive material 40 in a BOC semiconductor packaging process in accordance with an exemplary embodiment of the invention. Referring to FIG. 7, the adhesive material 40 may be positioned as desired on a component of a BOC package 50, for example on the substrate 54. The microcapsules 44 may be distributed in a variety of types of carriers 42, such as an adhesive tape as shown in FIG. 7. Alternatively, the adhesive material 40 may also be a liquid, paste, or other soft solid suitable for use in a semiconductor manufacturing process. After the adhesive material 40 is positioned as desired on the substrate 54, the other component to be bonded, for example an integrated circuit (IC) chip 52, may be placed in contact with the adhesive material 40.

The described sequence of positioning is not required, and instead the adhesive material 40 may be first positioned on the IC chip 52, and the substrate 54 later brought in contact with the adhesive material 40. Alternatively, the substrate 54 and IC chip 52 may be simultaneously brought into contact with the adhesive material 40.

As shown in FIG. 8, the adhesive material 40 is positioned between the components of the BOC package 50 to be bonded. The adhesive material 40 may be activated by applying an external influence, such as heat and/or pressure. Upon application of the external influence, the contents of the microcapsules 44 are released into the carrier 42, beginning the chemical reaction of the resin and hardener. A catalyst may also be included in the adhesive material 40 to facilitate this chemical reaction.

Referring to FIG. 9, as the chemical reaction progresses, the epoxy compound 46 is produced, bonding the substrate 54 to the IC chip 52. During the curing cycle and an optional postcure process, the epoxy compound continues to crosslink and develop its thermal, chemical and structural properties. The final structure is shown in FIG. 9, with the substrate 54 and the IC chip 52 bonded together by the epoxy compound 46.

Figure 10:
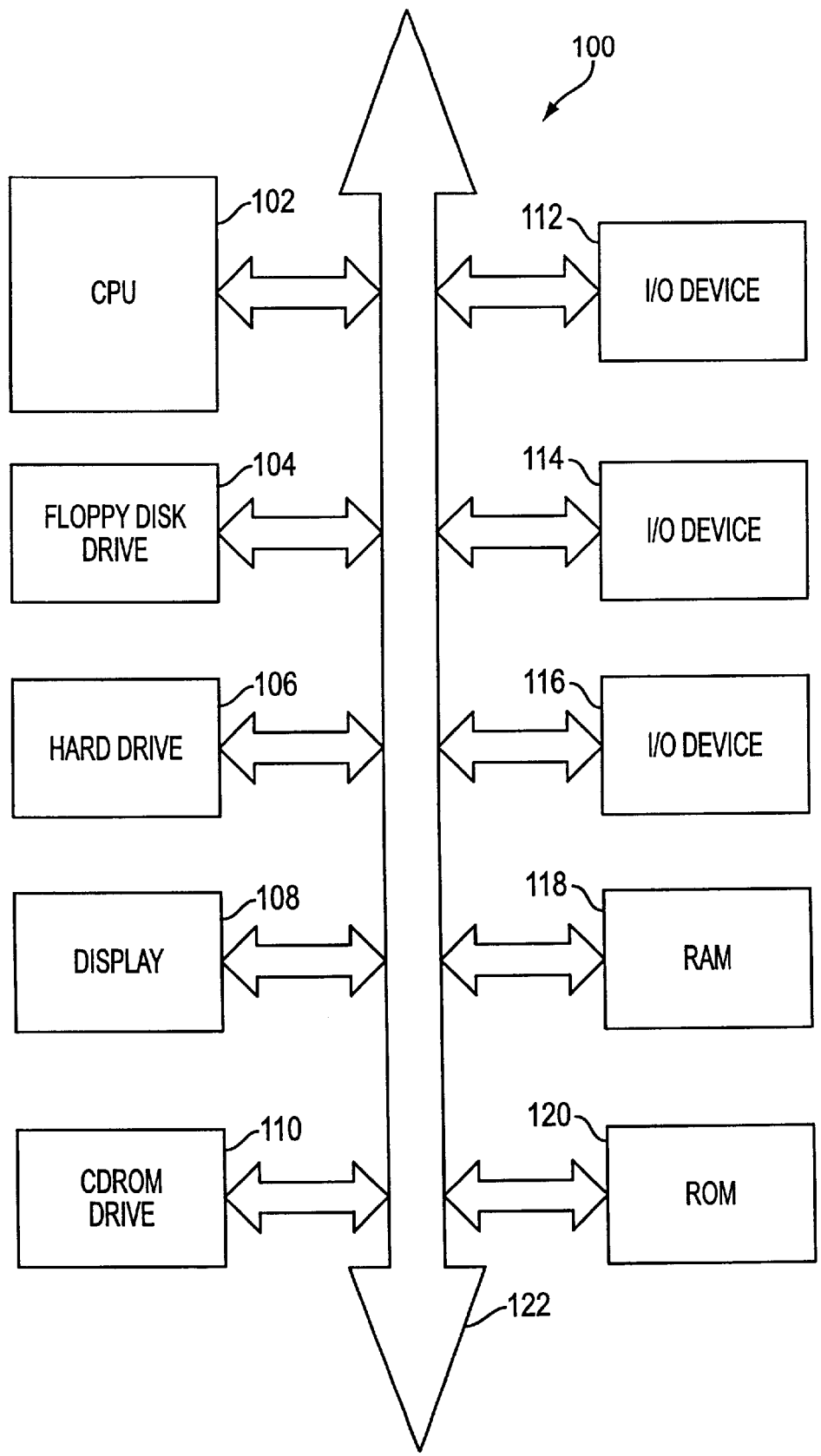
FIG. 10 illustrates a processor system including a semiconductor package which employs adhesive structures and bonding process methodologies in accordance with an exemplary embodiment of the invention.

FIG. 10 illustrates an exemplary processor system that may include semiconductor components produced using the BOC packaging methodologies of the invention. Referring to FIG. 10, the processor system, which may be a computer system 100, for example, generally comprises a central processing unit (CPU) 102, for example, a microprocessor, that communicates with one or more input/output (I/O) devices 112, 114, 116 over a system bus 122. The computer system 100 also includes random access memory (RAM) 118, a read only memory (ROM) 120 and may also include peripheral devices such as a floppy disk drive 104, a hard drive 106, a display 108 and a compact disk (CD) ROM drive 110 which also communicate with the processor 102 over the bus 122. Any or all of the elements of the processor system 100, for example processor 102, RAM 118, ROM 120 or a controller or other IC chips contained within the other components shown in FIG. 10 may include semiconductor packages 50 formed using the adhesive materials and processing methodologies described above with reference to FIGS. 3–9. It should be noted that FIG. 10 is merely representative of one of many different types of architectures of a processor system 100 which may employ the invention. It may also be desirable to integrate the CPU 102 and the RAM 118 on a single chip.

Although the invention has been described with reference to a board-on-chip (BOC) package process, this is not required and other packaging processes may be used in accordance with the invention. For example, the invention may also be used with chip-on-board (COB), lead-on-chip (LOC) and wafer backside lamination (WBL) processes.

The adhesive structures and processes of the invention provide an adhesive material suitable for use in semiconductor packaging. Because the adhesive material is provided with the microcapsules already distributed in the carrier, the conventionally-required steps of monitoring the proportions and thoroughly mixing the resin and hardener may not be required. In addition, resin, hardener and catalyst materials conventionally unsuitable for semiconductor processing may be used in accordance with the invention, permitting combination of epoxy materials exhibiting room-temperature attachment, fast curing, and extended pot life characteristics as desired.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. An adhesive material, comprising:
   a carrier; and
   a plurality of microcapsules distributed in said carrier, wherein at least one resin material is included in at least one of said microcapsules;
   whereby said carrier and contents of said microcapsules combine upon application of an external influence so as to permit said adhesive material to create a bond.

2. An adhesive material as in claim 1, wherein said bond attaches a semiconductor component to a mounting surface.

3. An adhesive material as in claim 1, wherein at least one resin material is included in said carrier.

4. An adhesive material as in claim 1, wherein a plurality of resin materials are included in at least one of said carrier and said microcapsules.

5. An adhesive material as in claim 1, wherein a hardener is included in said carrier.

6. An adhesive material as in claim 1, wherein a catalyst is included in at least one of said carrier and said microcapsules.

7. An adhesive material as in claim 6, wherein said catalyst activates at a temperature less than about 150 degrees Celsius.

8. An adhesive material as in claim 6, wherein said catalyst is a room temperature reactive catalyst.

9. An adhesive material as in claim 1, wherein a catalyst and a hardener are included in said carrier.

10. An adhesive material as in claim 1, wherein a hardener is included in said carrier, and a catalyst is included in said microcapsules.

11. An adhesive material as in claim 1, wherein a catalyst is included in a subset of said microcapsules, and a hardener is included in another subset of said microcapsules which do not include a resin.

12. An adhesive material as in claim 1, wherein said external influence includes a compressive force sufficient to release contents of said microcapsules.

13. An adhesive material as in claim 12, where said compressive force is applied when the adhesive material is at a temperature less than about 150 degree Celsius.

14. An adhesive material as in claim 12, where said compressive force is applied when the adhesive material is at a temperature about equal to room temperature.

15. An adhesive material as in claim 1, wherein said external influence includes a shearing force.

16. An adhesive material as in claim 1, wherein said external influence includes exposure to a temperature above room temperature.

17. An adhesive material as in claim 1, wherein said adhesive material is exposed to a post-cure heat treatment.

18. An adhesive material as in claim 1, wherein said adhesive material bonds a semiconductor component to a mounting surface in a board-on-chip (BOC) package.

19. A board-on-chip (BOC) package, comprising:
   a semiconductor component;
   a substrate;
   an adhesive material interposed between and attaching said semiconductor component and said substrate, said adhesive material comprising:
      a carrier; and
      a plurality of microcapsules distributed in said carrier, wherein a resin material is included in at least one of said microcapsules;
      whereby said carrier and contents of said microcapsules combine upon application of an external influence so as to permit said adhesive material to create a bond.

20. A BOG package as in claim 19, wherein said bond attaches said semiconductor component to said substrate.

21. A BOC package as in claim 19, wherein at least one resin material is included in said carrier.

22. A BOC package as in claim 19, wherein a plurality of resin materials are included in said carrier and said microcapsules.

23. A BOC package as in claim 19, wherein a hardener is included in said carrier and a subset of said microcapsules which do not include a resin.

24. A BOC package as in claim 19, wherein a catalyst is included in at least one of said carrier and said microcapsules.

25. A BOG package as in claim 24, wherein said catalyst activates at a temperature less than about 150 degrees Celsius.

26. A BOC package as in claim 24, wherein said catalyst is a room temperature reactive catalyst.

27. A BOC package as in claim 19, wherein a catalyst and a hardener are included in said carrier.

28. A BOC package as in claim 19, wherein a catalyst is included in said microcapsules.

29. A BOG package as in claim 19, wherein a resin is included in said carrier, a catalyst is included in a subset of said microcapsules, and a hardener is included in another subset of said microcapsules which do not include a resin.

30. A BOC package as in claim 19, wherein said external influence includes a compressive force sufficient to release contents of said microcapsules.

31. A BOC package as in claim 30, where said compressive force is applied when the adhesive material is at a temperature less than about 150 degree Celsius.

32. A BOC package as in claim 30, where said compressive force is applied when the adhesive material is at a temperature about equal to room temperature.

33. A BOG package as in claim 19, wherein said external influence includes a shearing force.

34. A BOG package as in claim 19, wherein said external influence includes exposure to a temperature above room temperature.

35. A BOG package as in claim 19, wherein said adhesive material is exposed to a post-cure heat treatment.

36. A processor system, comprising:
   a processor; and
   a semiconductor device connected to said processor, at least one of said processor and said semiconductor device having a semiconductor package including an adhesive material comprising:
      a carrier; and
      a plurality of microcapsules distributed in said carrier, wherein at least one resin material is included in at least one of said microcapsules;
      whereby said carrier and contents of said microcapsules combine upon application of an external influence so as to permit said adhesive material to create a bond.

37. A system as in claim 36, wherein said bond attaches a semiconductor component to a mounting surface in a board-on-chip (BOC) package.

38. A system as in claim 36, wherein said processor and said semiconductor device are integrated on a same integrated circuit chip.

39. An adhesive material, comprising:
   a carrier; and
   a plurality of microcapsules distributed in said carrier, wherein a catalyst is included in at least one of said microcapsules;
   whereby said carrier and contents of said microcapsules combine upon application of an external influence so as to permit said adhesive material to create a bond.

40. An adhesive material, comprising:
   a carrier; and
   a plurality of first and second microcapsules distributed in said carrier, wherein a resin material is included in said first microcapsules and a catalyst is included in said second microcapsules;
   whereby said carrier and contents of said microcapsules combine upon application of an external influence so as to permit said adhesive material to create a bond.

* * * * *